(12) United States Patent
Cheng et al.

(10) Patent No.: US 11,201,112 B2
(45) Date of Patent: Dec. 14, 2021

(54) FULLY-ALIGNED SKIP-VIAS

(71) Applicant: International Business Machines Corporation, Armonk, NY (US)

(72) Inventors: Kenneth Chun Kuen Cheng, Albany, NY (US); Chanro Park, Clifton Park, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 94 days.

(21) Appl. No.: 16/748,951

(22) Filed: Jan. 22, 2020

(65) Prior Publication Data
US 2021/0225760 A1 Jul. 22, 2021

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76816* (2013.01); *H01L 21/76832* (2013.01); *H01L 21/76843* (2013.01); *H01L 21/76897* (2013.01); *H01L 23/528* (2013.01)

(58) Field of Classification Search
CPC ........... H01L 23/5226; H01L 21/76897; H01L 23/528; H01L 21/76832; H01L 21/76843; H01L 21/76816; H01L 21/76852; H01L 21/76834; H01L 21/76885
USPC ......................................................... 257/774
See application file for complete search history.

(56) References Cited

U.S. PATENT DOCUMENTS

| | | | |
|---|---|---|---|
| 7,071,097 B2 | 7/2006 | Colburn | |
| 9,198,293 B2 | 11/2015 | Chase et al. | |
| 9,613,861 B2 | 4/2017 | Anderson et al. | |
| 9,984,919 B1 | 5/2018 | Zhang et al. | |
| 10,244,629 B1 | 3/2019 | Balasubramanian et al. | |
| 2009/0236143 A1 | 9/2009 | Nakamura | |
| 2015/0056800 A1 | 2/2015 | Mebarki et al. | |
| 2015/0171010 A1 | 6/2015 | Bristol et al. | |
| 2016/0111329 A1 | 4/2016 | Zhang et al. | |
| 2018/0049312 A1 | 2/2018 | Gailus et al. | |
| 2018/0061707 A1 | 3/2018 | Clevenger et al. | |

(Continued)

*Primary Examiner* — Caleen O Sullivan
(74) *Attorney, Agent, or Firm* — Cantor Colburn LLP; L. Jeffrey Kelly

(57) ABSTRACT

An interconnect structure includes a first electrically conductive via portion on an upper surface of a substrate, the first electrically conductive via elongated along a first direction, and a first ILD material on the substrate and covering the first electrically conductive via portion. The first ILD material includes an ILD upper surface exposing a via surface of the first electrically conductive via portion. A second electrically conductive via portion is on the ILD upper surface and the via upper surface thereby defining a contact area between the first electrically conductive via portion and the second electrically conductive via portion. The second electrically conductive via portion elongated along a second direction orthogonal with respect to the first direction. A second ILD material is on the ILD upper surface to cover the second electrically conductive via portion. The first and second electrically conductive via portions are fully aligned at the contact area.

14 Claims, 10 Drawing Sheets

(56) References Cited

U.S. PATENT DOCUMENTS

2020/0027782 A1\* 1/2020 Jiang ................. H01L 21/02186
2021/0050260 A1\* 2/2021 Park .................. H01L 21/31116

\* cited by examiner

FULLY-ALIGNED SKIP-VIAS

BACKGROUND

The present invention generally relates to fabrication methods and resulting semiconductor-based integrated circuits (ICs). More specifically, the present invention relates to methods and resulting interconnect structures of ICs having one or more fully-aligned skip-vias.

Fabricating semiconductor devices typically involves forming multiple electrical connections to each device formed on a substrate, which can include tens, hundreds, thousands, and even millions of devices. Voids filled with a conductive material form conductive vias that connect the device connections to higher device levels for eventual connection to the electrical package contacts.

There are times where an IC design requires an electrical connection between first and second metallization layers that are not adjacent to one another and have intermediate layers between them. In these cases, "skip-vias" are used to form a conduction path from the first metallization layer to the second metallization layer without establishing an electrical connection to the intermediate layers. For example, an IC substrate can include a stack formed from first, second, and third metallization layers. The third metallization layer is formed after establishing the underlying first metallization layer and the intervening second metallization layer. Accordingly, a skip-via can be formed through the substrate, which interconnects the first metallization layer and the third metallization layer while remaining electrically isolated from the intermediate second metallization layer.

SUMMARY

According to a non-limiting embodiment of the invention, an interconnect structure includes a first electrically conductive via portion on an upper surface of a substrate, the first electrically conductive via elongated along a first direction, and a first interlayer dielectric (ILD) material on the substrate and covering the first electrically conductive via portion. The first ILD material includes an ILD upper surface exposing a via surface of the first electrically conductive via portion. A second electrically conductive via portion is on the ILD upper surface and the via upper surface thereby defining a contact area between the first electrically conductive via portion and the second electrically conductive via portion. The second electrically conductive via portion elongated along a second direction orthogonal with respect to the first direction. A second ILD material is on the ILD upper surface to cover the second electrically conductive via portion. The first and second electrically conductive via portions are fully aligned at the contact area.

According to another non-limiting embodiment of the invention, a method of fabricating an interconnect structure comprises forming a first electrically conductive via portion on an upper surface of a substrate, first electrically conductive via portion elongated along a first direction, depositing a first fill material 1 on the substrate to cover the first electrically conductive via portion, and etching the first fill material to expose an upper surface of the first electrically conductive via portion. The method further comprises forming a second electrically conductive via portion on the first fill material and the upper surface of the first electrically conductive via portion to establish a contact area. The second electrically conductive via portion is elongated along a second direction orthogonal with respect to the first direction. The method further comprises depositing a second fill material on the first fill material to cover the second electrically conductive via portion. The first and second electrically conductive via portions are fully aligned at the contact area.

According to yet another non-limiting embodiment, a method of fabricating an interconnect structure comprises forming a first electrically conductive via portion on an upper surface of a substrate. The first electrically conductive via is elongated along a first direction. The method further comprises depositing a via liner material on sidewalls and an upper surface of the first electrically conductive via portion, depositing a first interlayer dielectric (ILD) material on the substrate to cover the first electrically conductive via portion, and etching the ILD material to expose an upper surface of the first electrically conductive via portion and the via material defining a via liner between the first ILD and the first electrically conductive via portion. The method further comprises forming a second electrically conductive via portion on the first ILD and the upper surface of the first electrically conductive via portion to establish a contact area. The second electrically conductive via portion elongated along a second direction orthogonal with respect to the first direction. The method further comprises depositing a second ILD material on the first ILD material to cover the second electrically conductive via portion. The first and second electrically conductive via portions are fully aligned at the contact area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-12 depict a process flow for forming an interconnect structure according to embodiments of the present invention, in which:

FIG. 1 depicts an intermediate interconnect structure after an initial set of fabrication operations according to a non-limiting embodiment of the invention;

FIG. 2 depicts the interconnect structure following patterning of a first photoresist layer according to a non-limiting embodiment of the invention;

FIG. 3 depicts the interconnect structure after transferring the first pattern into a first metal layer to form a first metal via portion according to a non-limiting embodiment of the invention;

FIG. 4 depicts the interconnect structure after removing remaining portions of the masking layers from the upper surface of the first metal via portion according to a non-limiting embodiment of the invention;

FIG. 5 depicts the interconnect structure after recessing a first interlayer dielectric that surrounds the first metal via portion according to a non-limiting embodiment of the invention;

FIG. 6 depicts the interconnect structure following deposition of a second metal layer and second masking layers on an upper surface of the first interlayer dielectric according to a non-limiting embodiment of the invention;

FIG. 7 depicts the interconnect structure following patterning of a second photoresist layer according to a non-limiting embodiment of the invention;

FIG. 9 depicts the interconnect structure after recessing a second interlayer dielectric that surrounds the second metal via portion according to a non-limiting embodiment of the invention;

FIG. 10 depicts the interconnect structure following deposition of a third metal layer and patterning a third photoresist layer according to a non-limiting embodiment according to a non-limiting embodiment of the invention;

FIG. 12 depicts an interconnect structure including a completed fully-aligned skip-via according to a non-limiting embodiment of the invention.

FIGS. 13-15 depict a process flow for forming an interconnect structure according to embodiments of the present invention, in which:

FIG. 13 depicts an interconnect structure after forming a first metal via portion according to a non-limiting embodiment of the invention;

FIG. 14 depicts the interconnect structure following deposition of an adhesion layer that covers the first metal via portion according to a non-limiting embodiment of the invention; and FIG. 15 depicts the interconnect structure after recessing a first interlayer dielectric expose a first metal via portion including a via liner according to a non-limiting embodiment of the invention.

Figure 1:
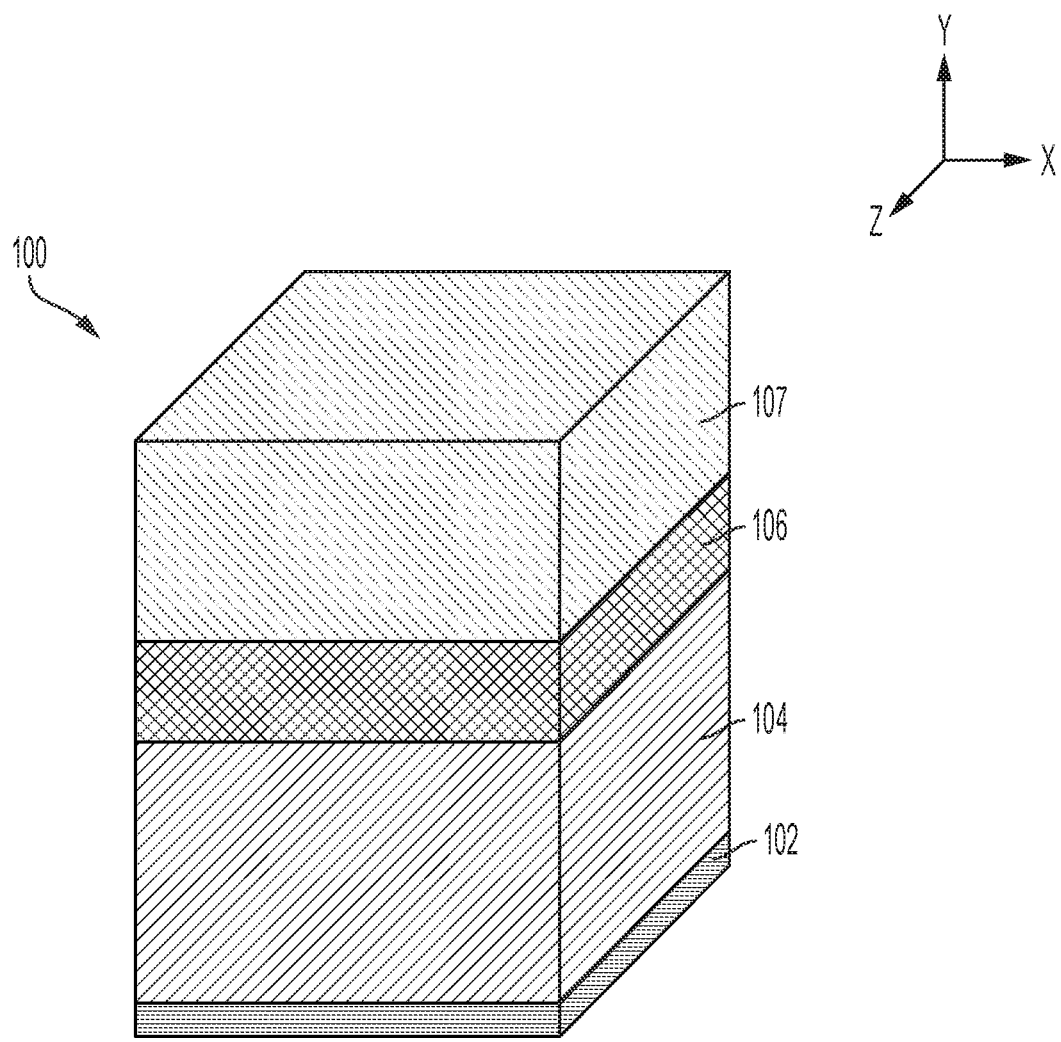

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, skip-vias are typically formed through one or more dielectric layers to establish an electrically conductive connection between a pair of targeted metallization layers, while bypassing (i.e., avoiding an electrically conductive connection) with one or more intervening metallization layers located between the targeted metallization layers.

There are two conventional fabrication methods that are typically used to form skip-vias. A first method involves forming a single via void through the interconnect structure after all the interconnect levels are formed, and then subsequently performing a single metal fill process that fills the via void with a metal material to form the skip-via. This method, however, has tendency to form non-uniform via voids, which in turn form skip-vias with undesirable non-uniform profiles. In addition, air gaps are often formed when filling a deep single void which undesirably increases the resistance of the resulting skip-via.

A second method involves performing well-known damascene techniques layer-by-layer to stack multiple via portions that contact one another to form a skip-via. To form each next-level via portion, the damascene technique first deposits a dielectric layer on the underlying metal layer and then deposits a metal material in a via void formed in the dielectric layer. However, the stack of individual via portions formed using damascene techniques is susceptible to misalignment of a connected pair of via portions. This misalignment reduces the contact area of the via pairs, thereby undesirably increasing the overall resistance of the skip-via. In additional, the damascene stacking method lacks the ability to control the distance between the skip-via and neighboring metal lines (isolated to a single layer) or metal vias (extending through multiple layers). As a result, the resulting skip-via is susceptible to undesirable current leakages, metal short-connections and reduced breakdown voltages.

Turning now to an overview of the aspects of the invention, one or more embodiments of the invention address the above-described shortcomings of the prior art by performing a series of novel subtractive patterning processes to form a stack of individual via portions. Each pair of via portions are fully aligned to define a fully-aligned (FA) skip-via. The FA via pairs increase the contact area, thereby reducing overall interconnect resistance of the FA skip-via. In addition, the subtractive patterning process employed to form the FA skip-via allows for trimming one or more of the via portions. As a result, the distance between a given via portion of the FA skip-via and a neighboring metal line and/or metal via can be reduced.

Turning now to a more detailed description of aspects of the present invention, FIGS. 1-12 depict a process flow for forming an interconnect structure according to embodiments of the present invention. FIG. 1 depicts an intermediate interconnect structure 100 according to a non-limiting embodiment of the invention. In the present specification and claims, an "intermediate" interconnect structure is defined as an interconnect structure in a stage of fabrication prior to a final stage. The interconnect structure 100 includes a substrate layer 102, a first (e.g., lower) electrically conductive layer 104 (e.g., a metal layer), a first hardmask layer 106, and a first photoresist layer 107. The interconnect structure 100 is shown extending along a first axis (e.g., X-axis) to define a length, a second axis (e.g., Y-axis) to define a height, and a third axis (e.g., Z-axis) to define a width.

The substrate layer 102 can include a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate 102 can include a bulk semiconductor substrate or a semiconductor-on-insulator (SOI) substrate. The at least one semiconductor device can be a field effect transistor, a bipolar transistor, a diode, a resistor, a capacitor, an inductor, an electrically programmable fuse, or any combination thereof. Optionally, the substrate 102 can further include at least one dielectric material layer (not shown separately) and metal interconnect structures (not shown separately) embedded therein such as metal lines and/metal vias.

The metal layer 104 can include various metal materials such as copper (Cu), tungsten (W), aluminum (Al), cobalt (Co), ruthenium (Ru), rhodium (Rh), platinum (Pt), molybdenum (Mo), or any combination thereof. The metal layer 104 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the metal layer 104 can be selected based on a desired application of the interconnect structure 100, and assists in determining a height of a lower metal via portion (not shown in FIG. 1) as described in greater detail below.

Although the metal layer 104 is shown as being formed directly on the substrate 102, the interconnect structure 100 is not limited thereto. For example, one or more additional layers including, but not limited to, an adhesion layer, nucleation layer and/or etch stop layer can be formed between the substrate 102 and the metal layer 104 without departing from the scope of the invention.

The hardmask layer 106 can include various hardmask materials including, but not limited, SiN, $SiO_2$, SiON, SiCN TiN, TaN, Ti, Ta, or any combination of thereof. A PECVD process, for example, can be performed to deposit the hardmask layer 106.

The first photoresist layer 107 can include an organic light-sensitive material as understood by one of ordinary skill in the art, which can be deposited on the upper surface of the first hardmask layer 106 using various deposition methods including, for example, spin coating.

Figure 2:
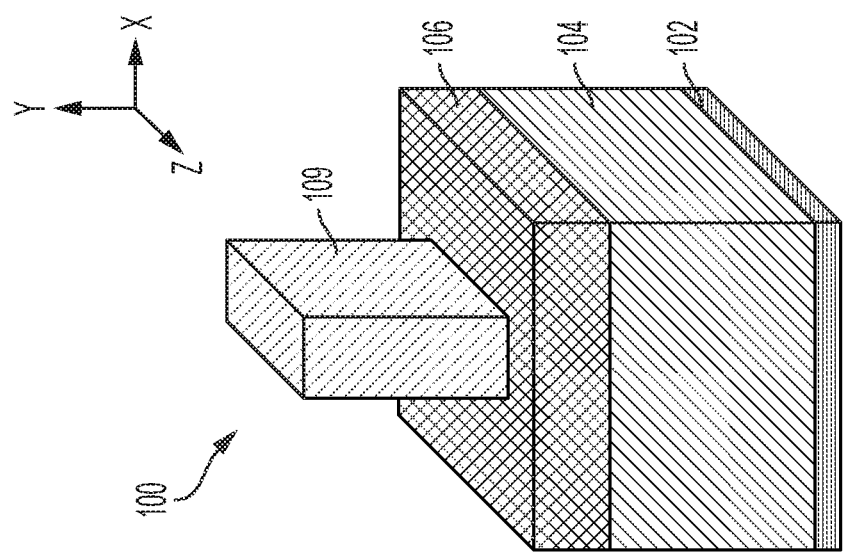

Turning to FIG. 2, the interconnect structure 100 is shown after patterning the first photoresist layer 107 to expose portions of the underlying first hardmask layer 106. The patterning process includes interposing a photomask (not shown) between the first photoresist layer 107 and a light source such as, for example, an ultraviolet (UV) light source. The photomask includes openings formed therethrough. In this manner, solid portions of the photomask block a first portion of the UV light, while a second portion of the UV light passes through the mask openings and reaches the first photoresist layer 107. The UV light reacts with a portion of the first photoresist layer 107 so as to remove exposed photoresist portions, thereby forming a patterned first photoresist element 109 that extends along the upper surface of the first hardmask layer 106 in a direction parallel to the upper surface of the substrate layer 102. Although the first photoresist element 109 is patterned with a width that extends a greater distance along the Z-axis compared to the length extending along the X-axis (i.e., is elongated along the Z-axis), the pattern of the photoresist element 109 is not limited thereto. For example, the first photoresist element 109 can be patterned with a length that extends a greater distance along the X-axis compared to the width extending along the Z-axis. In any case, the first photoresist element 109 serves to define the dimensions and profile of a subsequently formed metal via portion (not shown in FIG. 2) as described in greater detail below.

Figure 3:
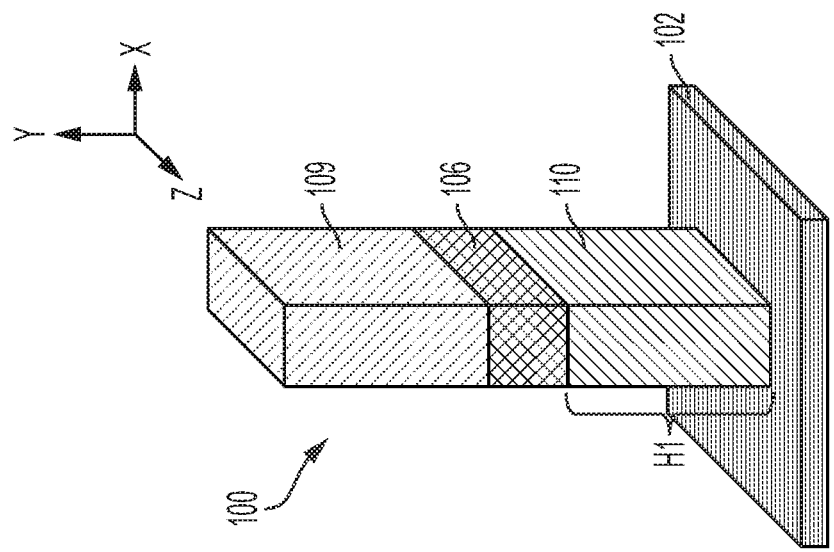

Referring to FIG. 3, the interconnect structure 100 is shown after transferring the pattern of the photoresist element 109 into the first hardmask layer 106 and the first metal layer 104. Accordingly, a first metal via portion 110, e.g., a lower metal via portion 110, is formed on an upper surface of the substrate layer 102. A directional reactive ion etch (RIE) process can be performed, for example, to transfer the hardmask pattern into the metal layer to form the lower metal via portion 110. In one or more non-limiting embodiments of the invention, the lower metal via portion 110 is elongated along the Z-axis, i.e., extends along the Z-axis at a greater distance compared to the X-axis, and has a total height (H1).

Figure 4:
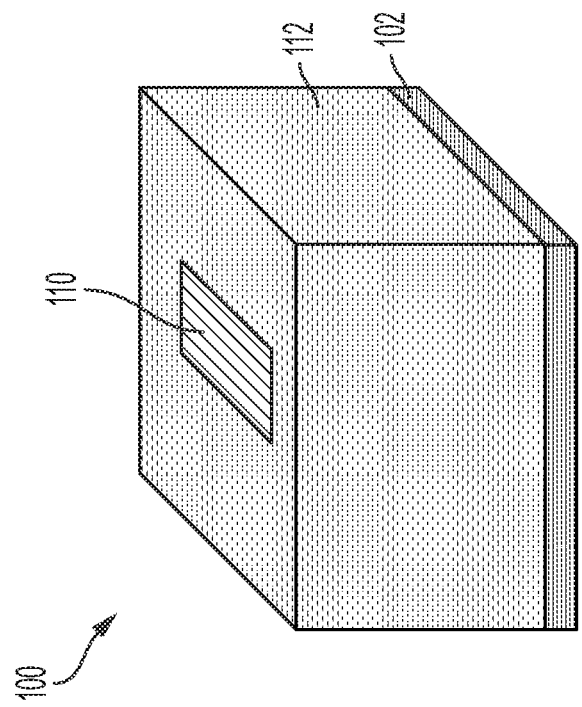

Referring to FIG. 4, the interconnect structure 100 is shown after removing remaining portions of the first hardmask layer 106 and the photoresist element 109. Accordingly, the upper surface and sidewalls of the lower metal via portion 110 are exposed. In one or more non-limiting embodiments of the invention, a chemical-mechanical planarization (CMP) process can be performed to recess the first hardmask layer 106 and the photoresist element 109, while stopping on an upper surface of the lower metal via portion 110.

Figure 5:
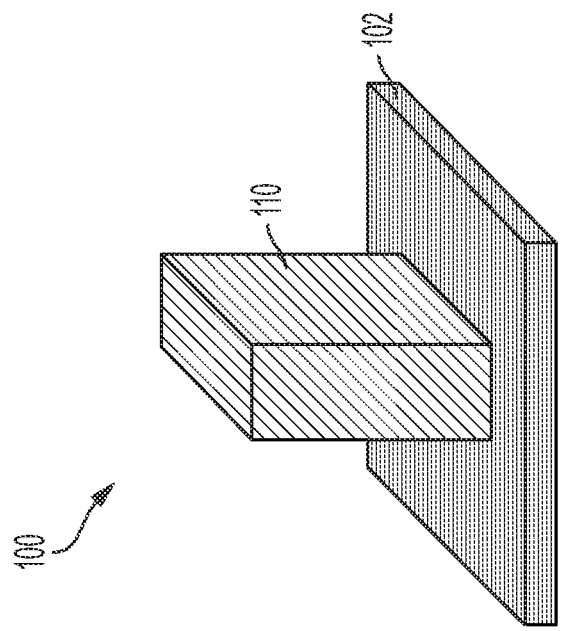

At FIG. 5, an interlayer dielectric (ILD) 112 is deposited on an upper surface of the substrate layer 102 to surround the lower metal via portion 110. The ILD 112 can include various low-dielectric materials, and can be deposited using, for example, chemical vapor deposition (CVD) or spin-on deposition techniques. A low-dielectric (low-k) material typically has a dielectric constant (k) that is less than approximately 3.9. In one or more non-limiting embodiments of the invention, the low-k material includes silicon dioxide ($SiO2$). As further illustrated in FIG. 5, the ILD 112 can be recessed by performing a CMP process, for example, until the upper surface of the lower metal via portion 110 is exposed.

Figure 6:
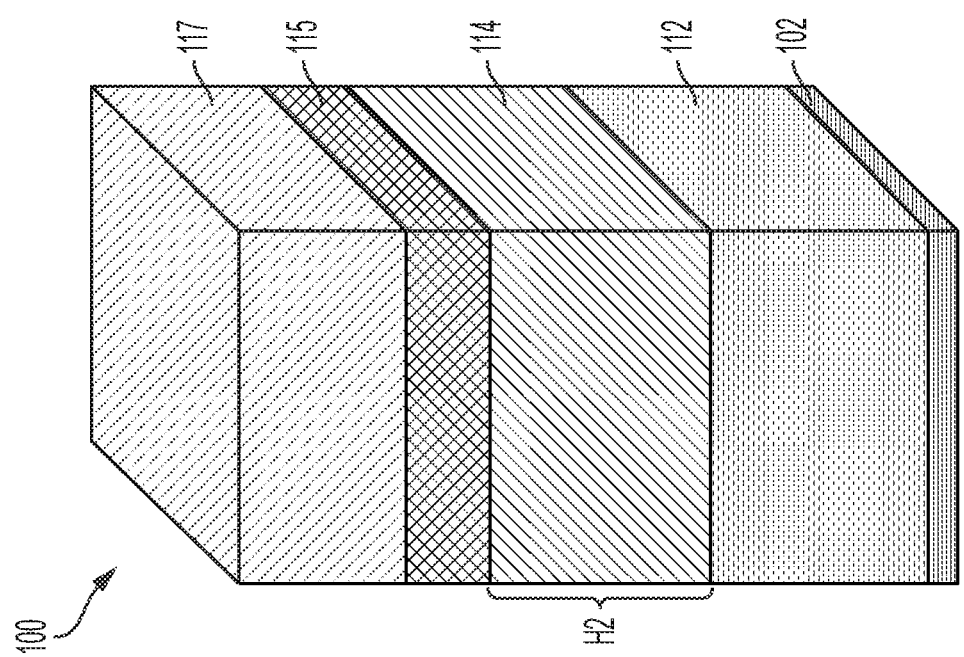

Turning to FIG. 6, the interconnect structure 100 is shown following deposition of a second (e.g., intermediate) metal layer 114 on the upper surface of the ILD 112 to initiate a "subtractive patterning process". Unlike depositing a second ILD on the underlying ILD 112 at this stage in the process as is the case in a conventional damascene process, the "subtractive patterning process" deposits the intermediate metal layer 114 on the ILD 112. A portion of the underlying metal void portion 110 is then subsequently recessed (i.e., "subtracted") with respect to an overlying metal void portion (not shown in FIG. 6) formed from the intermediate metal layer 114, thereby establishing a fully-aligned contact point between the lower metal via portion 110 and overlying via portion as described in greater detail below.

The intermediate metal layer 114 can include various metal materials such as copper (Cu), tungsten (W), aluminum (Al), cobalt (Co), ruthenium (Ru), rhodium (Rh), platinum (Pt), or any combination thereof. The intermediate metal layer 114 can be deposited by various deposition processes, including, by not limited to, chemical vapor deposition (CVD), plasma enhanced chemical vapor deposition (PECVD), sputtering, chemical solution deposition or plating that fills from the bottom upwards (e.g., a bottom-up plating process). The height of the intermediate metal layer 114 can be selected based on a desired application of the interconnect structure 100, and assists in determining a height of a subsequently formed metal via portion (not shown in FIG. 6) as described in greater detail below.

Still referring to FIG. 6, a second hardmask layer 115 is formed on an upper surface of the intermediate metal layer 114, and a second photoresist layer 117 is formed on an upper surface of the second hardmask layer 115. The second hardmask layer 115 can include various hardmask materials including, but not limited, SiN, SiO2, SiON, SiCN TiN, TaN, Ti, Ta, or any combination of thereof, and can be deposited according to PECVD process. The second photoresist layer 117 can include an organic light-sensitive material as understood by one of ordinary skill in the art, and can be deposited on the upper surface of the second hardmask layer 115 using various deposition methods including, for example, spin coating.

Figure 7:
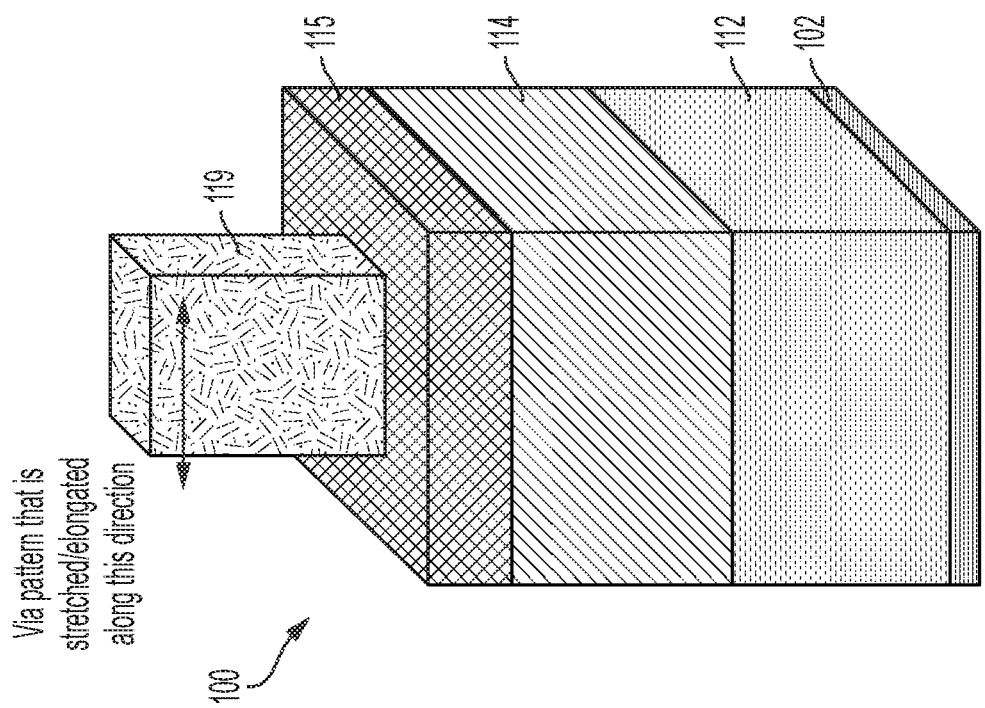

Turning now to FIG. 7, the interconnect structure 100 is shown after patterning the second photoresist layer 117 to form a second photoresist element 119 on an upper surface of the second hardmask layer 115 that extends along the upper surface of the first hardmask layer 106 in a direction parallel to the upper surface of the substrate layer 102. The second photoresist element 119 assists in determining the dimensions of a subsequently formed upper metal via portion (not shown in FIG. 7). In one or more embodiments of the invention, the second photoresist element 119 extends in an orthogonal direction (e.g., perpendicular) with respect to the lower metal via portion 110. That is, the second photoresist element 119 is elongated along the X-axis, for example, at a greater distance compared to the remaining axes (e.g., the Z-axis and the Y-axis).

Figures 8A, 8B:
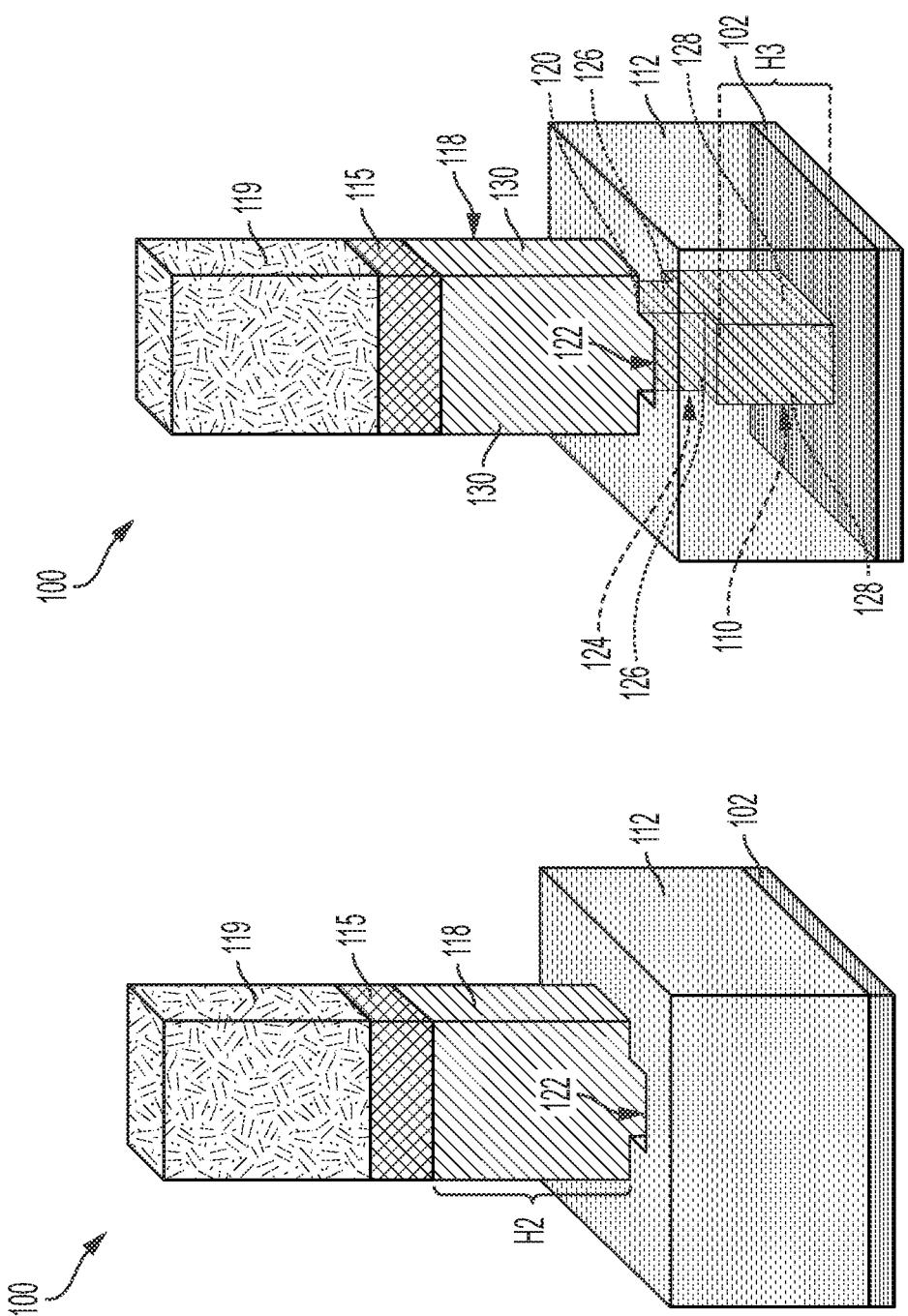
FIG. 8A depicts the interconnect structure after transferring the second pattern into the second metal layer to form a second metal via portion according to a non-limiting embodiment of the invention.
FIG. 8B depicts a transparent view of the first interlayer dielectric to show the interconnection between the first metal via portion and the second metal via portion according to a non-limiting embodiment of the invention.

Referring to FIGS. 8A-8B, the interconnect structure 100 is shown after transferring the pattern defined by the second photoresist element 119 into the underlying hardmask layer 115 and intermediate metal layer 114 to form a second metal via portion 118 (e.g., intermediate metal via portion). Similar lithography and patterning techniques used to form the lower metal via portion 110 (see FIG. 3) can also be performed to form the intermediate metal via portion 118.

The intermediate metal via portion 118 has a total height (H2) set by the intermediate metal layer 114. However, the pattern of defined by the previously formed second photoresist element 119 results in the intermediate metal via portion 118 being elongated along the X-axis, i.e., extending along the X-axis at a greater distance compared to the Z-axis. Accordingly, the intermediate metal via portion 118 completely extends across the upper surface of the lower metal via portion 110, thereby establishing physical contact between the two metal via portions 110 and 118 at a first contact area 120 (See FIG. 8B).

Still referring to FIGS. 8A and 8B, the interconnect structure 100 is shown after recessing exposed portions of the lower metal via portion 110 below the ILD 112 to form a cavity 122 at opposing sides of the intermediate metal via portion 118. In one or more non-limiting embodiments of the invention, the cavity 122 can be formed by performing a directional RIE process that is selective to the material of the lower metal via portion 110. That is, the RIE recess the exposed portion of the lower metal via portion 110 without substantially attacking the ILD 112. In this manner, the lower metal via portion 110 can be recessed without substantially attacking or etching the ILD 112.

The process of subsequently recessing the lower metal via portion 110 with respect to the intermediate metal via portion 118 is also referred to herein as a "subtractive patterning process." In one or more embodiments of the invention, the upper surface of the lower metal via portion 110 is recessed so that the lower metal via portion 110 has a decreased height (H3) that is less than the height (H2) of the intermediate metal via portion 118. The resulting cavity 122 effectively trims a portion of the lower metal via portion 110 so that a distance between a portion of the lower metal via portion 110 and a neighboring metal line and/or metal via (not shown) can be reduced. The portion of the lower metal via portion 110 protected by the overlying intermediate metal via portion 118 defines a trimmed portion 125 that is fully-aligned with the intermediate metal via portion 118.

FIG. 8B depicts the ILD 112 in transparency to show the trimmed portion 124 in greater detail. More specifically, the trimmed portion 124 extends from recessed upper surface of the lower metal via portion 110 with a width (e.g., extending along the Z-axis) that is less than the width of the underlying lower metal via portion 110 and contacts the intermediate metal via portion 118 at the first contact area 120. Because the upper surface of the lower metal via portion 110 is subsequently recessed with respect to the intermediate metal via portion 118, respective sides 126 of the trimmed portion 124 are fully aligned with the recessed upper surface of the lower metal via portion 110 and the lower surface of the intermediate metal via portion 118 rather than being formed with any overlap. In other words, recessing the upper surface of the lower metal via portion 110 with respect to the intermediate metal via portion 118 causes all sides 126 of the trimmed portion 124 to be flush (i.e., co-planar) with the sides 128 of the remaining lower metal via portion 110 and respective sides 130 of the intermediate metal via portions 118. Accordingly, a more precise contact area 120 is established, which in turn reduces the overall resistance between the lower metal via portion 110 and the intermediate metal via portion 118.

Figure 9:
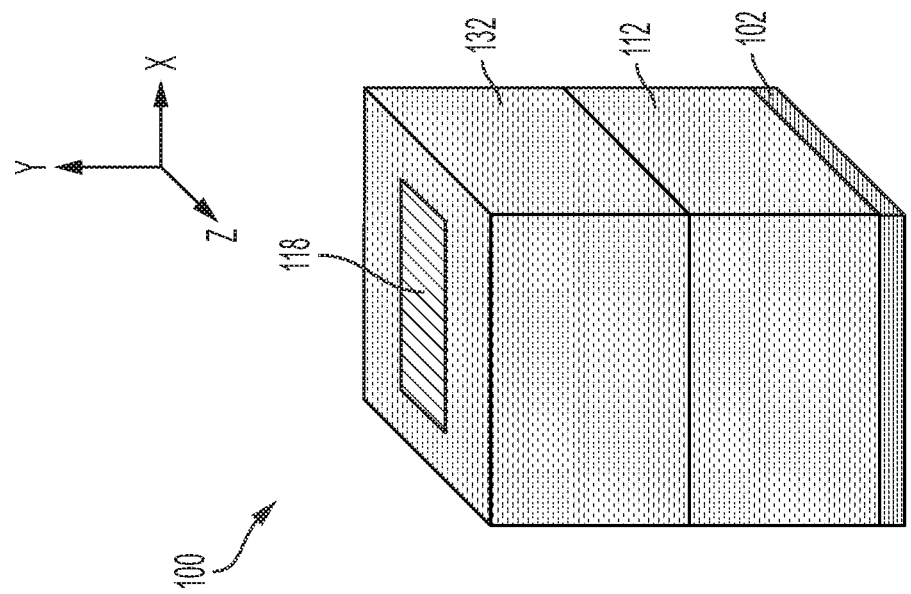

Referring now to FIG. 9, a second ILD 132 is deposited on an upper surface of the first ILD 112 to surround the intermediate via portion 118. The second ILD 132 can include various low-dielectric materials, and can be deposited using, for example, chemical vapor deposition (CVD) or spin-on deposition techniques. A low-dielectric (low-k) material typically has a dielectric constant (k) that is less than approximately 3.9. In one or more non-limiting embodiments of the invention, the low-k material includes silicon dioxide (SiO2). As further illustrated in FIG. 9, the second ILD 132 can be recessed by performing a chemical-mechanical planarization (CMP) process, for example, until the upper surface of the intermediate metal via portion 118 is exposed.

Figure 10:
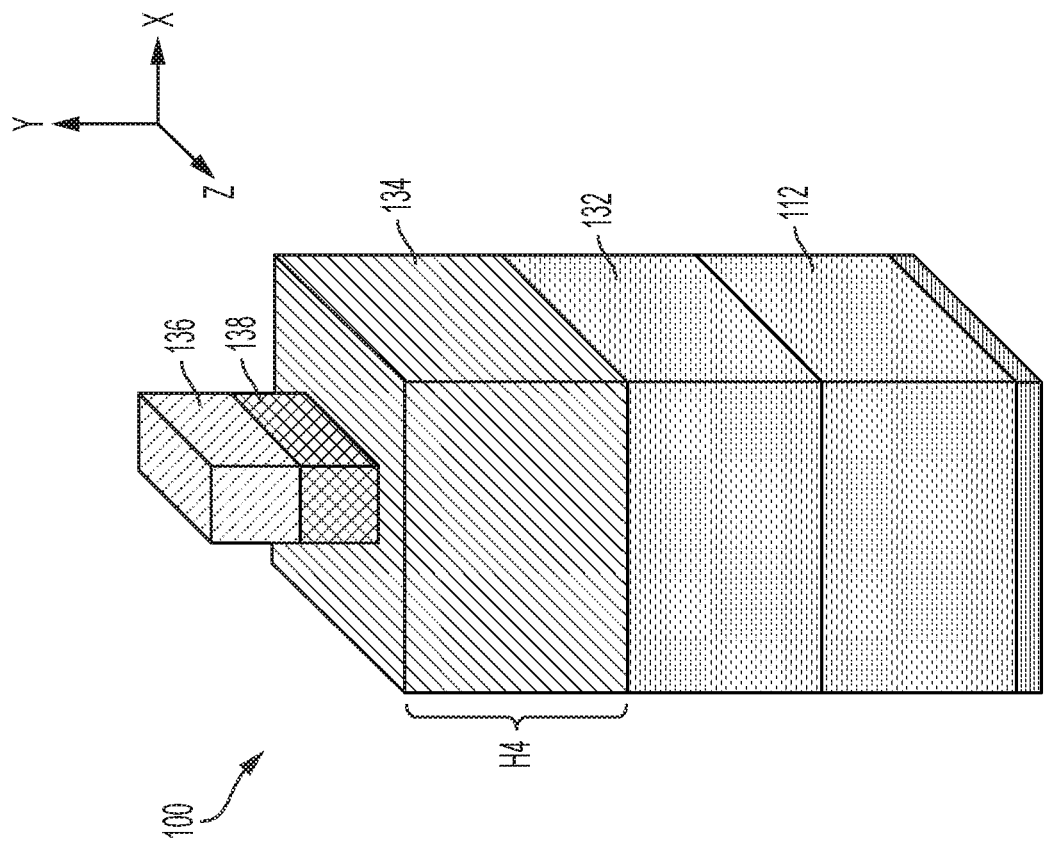

Referring to FIG. 10, the interconnect structure 100 is shown having a third metal layer 134 (e.g., upper metal layer 134) formed on an upper surface of the second ILD 132, along with a patterned third photoresist element 136 and patterned third hardmask element 138 on an upper surface of the upper metal layer 134. The height (H4) of the upper metal layer 134 can be selected based on a desired application of the interconnect structure 100, and assists in determining a height of a subsequently formed metal via portion (not shown in FIG. 10) as described in greater detail below.

The third photoresist element 136 and the third hardmask element 138 can be patterned known lithography and patterning techniques described herein. In one or more embodiments, the third photoresist element 136 and the third hardmask element 138 are patterned so that they are extend perpendicular with respect to the underlying intermediate metal via portion. For example, the third photoresist element 136 and the third hardmask element 138 extend along the Z-axis at a greater distance compared to the X-axis.

Figure 11A:
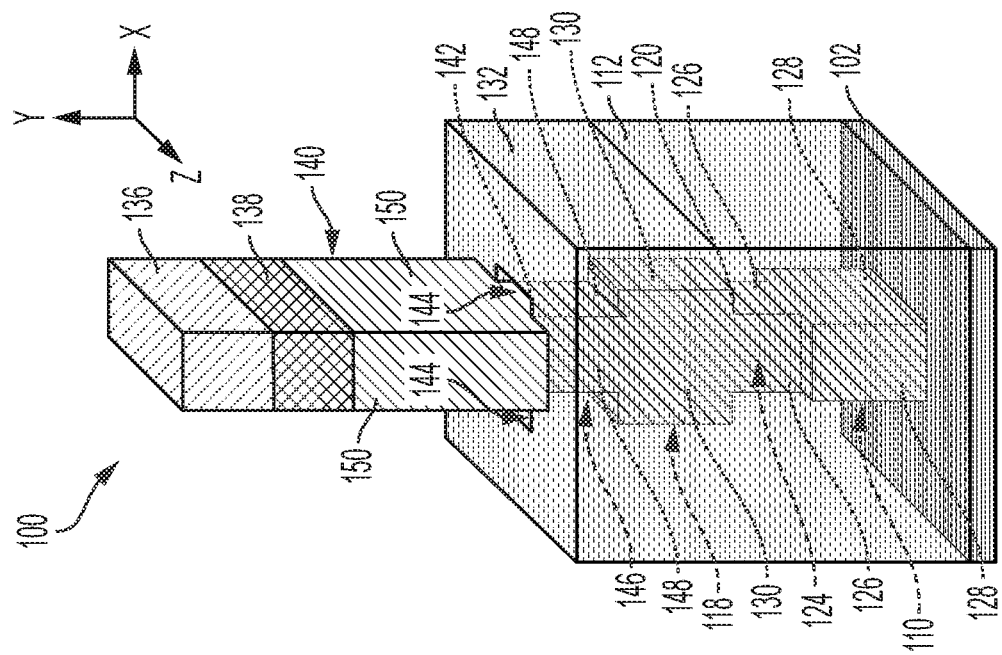
FIG. 11A depicts the interconnect structure after transferring the third pattern into the second metal layer to form a third metal via portion according to a non-limiting embodiment of the invention.
Figure 11B:
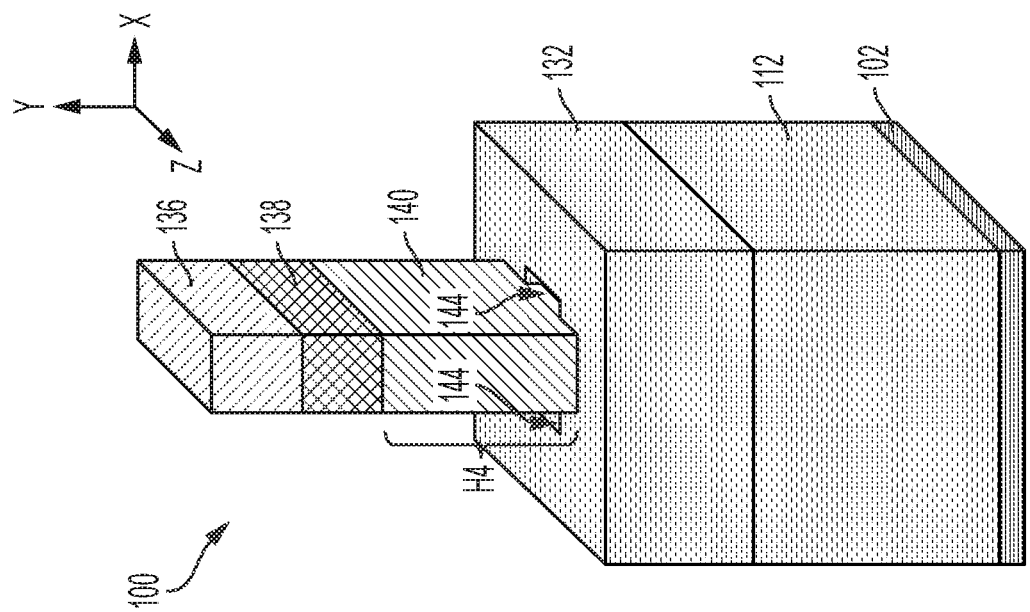
FIG. 11B depicts a transparent view of the second interlayer dielectric to show the interconnection between the second metal via portion and the third metal via portion according to a non-limiting embodiment.

Turning now to FIGS. 11A and 11B, the interconnect structure 100 is shown after transferring the pattern defined by the third photoresist element 138 and third hardmask element 136 into the metal layer 134 to form a third metal via portion 140 (e.g., upper metal via portion). Similar lithography and patterning techniques used to form the lower and intermediate metal via portions 110 and 118 described herein can also be performed to form the upper metal via portion 140.

The upper metal via portion 140 has a total height (H4) set by the previously non-recess upper metal via layer 134. In one or more embodiments, the upper metal via portion 140 has extends perpendicularly with respect to the intermediate metal via portion 118. For example, the upper metal via portion extends along the Z-axis at a greater distance compared to the X-axis. Accordingly, the upper metal via portion 140 completely extends across the upper surface of the intermediate metal via portion 118, thereby establishing physical contact between the two metal via portions 118 and 140 at a second contact area 142 (see FIG. 11B).

Still referring to FIGS. 11A and 11B, the interconnect structure 100 is shown after recessing exposed portions of the intermediate metal via portion 118 below the second ILD 132 to form a second cavity 144 at opposing sides of the upper metal via portion 140. In one or more non-limiting embodiments of the invention, the second cavity 144 can be formed by performing a directional RIE process that is selective to the second ILD material 132. In this manner, the intermediate metal via portion 118 can be recessed without substantially attacking or etching the second ILD 132.

As described herein, the process of subsequently recessing a portion of an underlying metal via portion with respect to a respective overlying metal via portion is referred to herein as a "subtractive patterning process." Accordingly, a subtractive patterning process can be performed to recess a portion of the intermediate metal via portion 118 with respect to the upper metal via portion 140. The resulting cavity 144 effectively trims a portion of the intermediate metal via portion 118 so that a distance between a portion of the intermediate metal via portion 118 and a neighboring metal line and/or metal via (not shown) can be reduced. The portion of the intermediate metal via portion 118 protected by the overlying upper metal via portion 140 defines a trimmed portion 146 that is fully-aligned with the upper metal via portion 140.

FIG. 11B depicts the first and second ILDs 112 and 132 in transparency to show the second trimmed portion 146 in greater detail. More specifically, the second trimmed portion 146 extends from recessed upper surface of the intermediate metal via portion 118 and contacts the upper metal via portion 140 at the first contact area 142. Because the upper surface of the intermediate metal via portion 118 is subsequently recessed with respect to the upper metal via portion 140, all sides 148 of the second trimmed portion 146 are fully aligned with the recessed upper surface of the intermediate metal via portion 118 and the lower surface of the upper metal via portion 140 rather than being formed with any overlap. In other words, recessing the upper surface of the intermediate metal via portion 118 with respect to the upper metal via portion 140 causes all sides 148 of the trimmed portion 146 to be flush (i.e., co-planar) with the sides 130 of the remaining intermediate metal via portion 118 and respective sides 150 of the upper metal via portion 140. Accordingly, a more precise second contact area 142 is established, which in turn reduces the overall resistance between the intermediate metal via portion 118 and the upper metal via portion 140.

Figure 12:
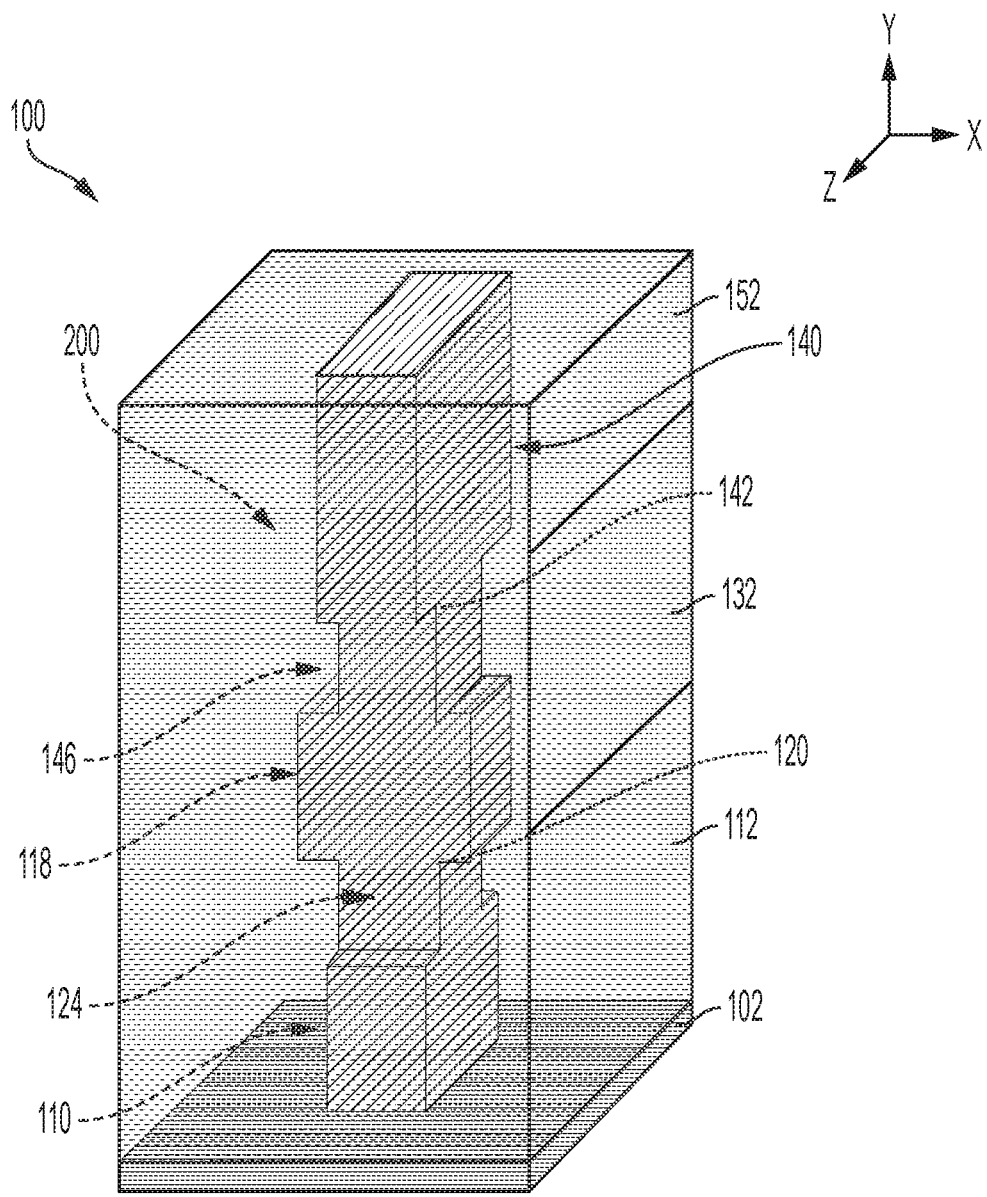

Turning to FIG. 12, an interconnect structure 100 including a completed fully-aligned (FA) skip-via 200 is illustrated according to a non-limiting embodiment of the invention. After forming the upper metal via portion 140, a third interlayer dielectric ILD 152 is deposited on an upper surface of the second ILD 132 to surround the upper via portion 140. The third ILD 152 can include various low-dielectric materials, and can be deposited using, for example, chemical vapor deposition (CVD) or spin-on deposition techniques. A low-dielectric (low-k) material typically has a dielectric constant (k) that is less than approximately 3.9. In one or more non-limiting embodiments of the invention, the low-k material includes silicon dioxide ($SiO_2$). As further illustrated in FIG. 12, the third ILD 152 can be recessed by performing a chemical-mechanical planarization (CMP) process, for example, until the upper surface of the upper metal via portion 140 is exposed.

Still referring to FIG. 12, the first, second and third ILDs 112, 132 and 152 are depicted in transparency to show the FA skip-via 200 in greater detail. The FA skip-via 200 includes a stack of individually formed metal via portions 110, 114 and 140. Although three metal via portions 110, 114 and 140, the FA skip-via 200 can include less metal via portions (e.g., two metal via portions) or more metal via portions (e.g., six metal via portion).

Each underlying via portion has a perpendicular orientation with respective overlying metal via portion. In addition, each underlying via portion is fully-aligned with a respective overlying metal via portion. For example, the lower metal via portion 110 is fully aligned with the intermediate metal via portion 118, and the intermediate metal via portion 118 is fully aligned with the upper metal via portion 140. Accordingly, more precise contact areas (e.g., 120 and 142) are established between an underlying metal via portion and a respective overlying metal via portion, which in turn reduces the overall resistance of the FA skip-via 200.

The FA skip-via 200 further includes first and second trimmed portions 124 and 146. As described herein, a subtractive patterning process can be performed to recess a portion of a targeted underlying metal via portions without substantially attacking a respective overlying metal via portion. Accordingly, a distance between portions of the skip-via 200 and one or more neighboring metal lines and/or metal vias (not shown) can be reduced to protect the FA skip-via 200 from undesirable current leakages, metal short-connections and reduced breakdown voltages.

Figure 13:
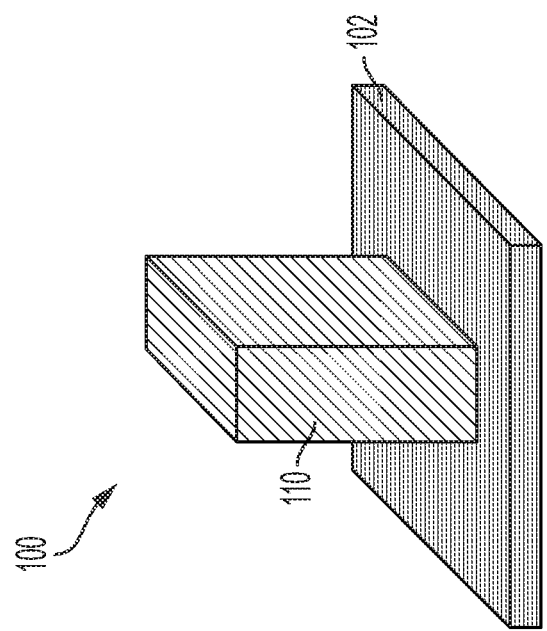
Figure 14:
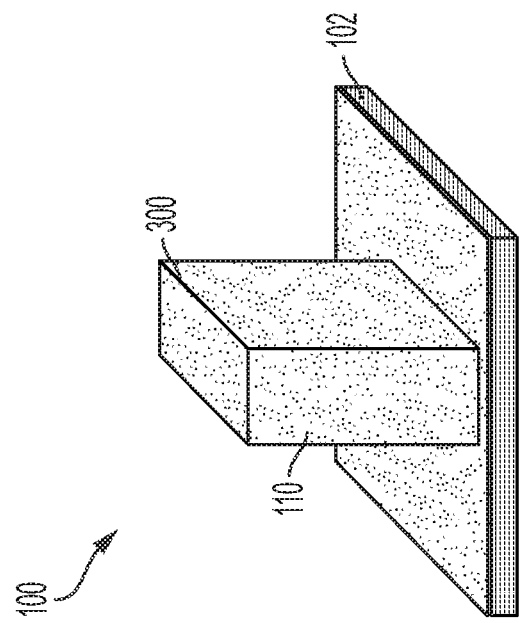
Figure 15:
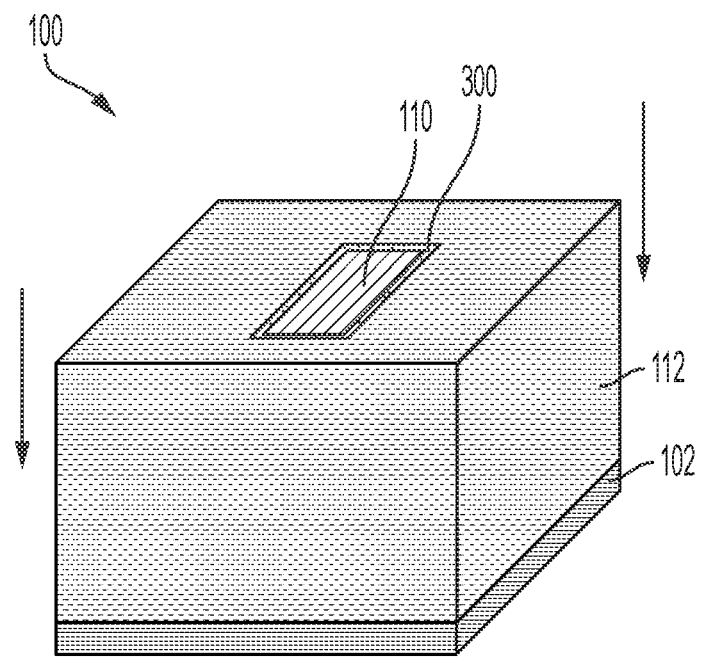

With reference now to FIGS. 13-15, a process flow for forming an interconnect structure including one or more via liners is depicted according to embodiments of the present invention. FIG. 13 illustrates an interconnect structure 100 at an intermediate stage of the process flow. At this intermediate stage, the interconnect structure 100 is shown after removing portions of a first hardmask layer and the photoresist element to provide a lower metal via portion 110 formed on an upper surface of a substrate 102. Descriptions of forming the lower metal via portion 110 is described above with reference to FIGS. 1-4.

Referring to FIG. 14, a via liner 300 is conformally deposited on the exposed surfaces of the lower metal via portion. The via liner 300 can include, for example, an adhesion liner including various materials including, but not limited to, tantalum nitride (TaN), titanium nitride (TiN) and titanium oxide ($Ti_2O_3$), and can have a thickness ranging, for example, from about 0.5 nm to about 20 nm. Various deposition process can be employed to deposit the via liner 300 including, but not limited to, ALD, CVD, plasma-enhanced ALD (PEALD), (PECVD) and physical-vapor deposition (PVD).

Turning to FIG. 15, an ILD 112 is deposited on an upper surface of the substrate layer 102 to cover the via liner 300 and lower metal via portion 110. The ILD 112 can include various low-dielectric materials, and can be deposited using, for example, chemical vapor deposition (CVD) or spin-on deposition techniques. A low-dielectric (low-k) material typically has a dielectric constant (k) that is less than approximately 3.9. In one or more non-limiting embodiments of the invention, the low-k material includes silicon dioxide ($SiO_2$). As further illustrated in FIG. 15, the ILD 112 can be recessed by performing a chemical-mechanical planarization (CMP) process, for example, until the upper surface of the lower metal via portion 110 is exposed. Accordingly, the intermediate interconnect structure can be formed having a via liner 300 interposed between the ILD 112 and the lower metal via portion 110. Although the via liner 300 is described as being formed on a lower metal via portion 110 (e.g., a first-level metal via portion), the process described above can be applied when subsequently forming one or more next-level metal via portions. Accordingly, one or more via liners 300 can be deposited to cover all sidewalls of a completed FA skip-via.

As described herein, embodiments of the invention address the above-described shortcomings of the prior art by performing a series of novel subtractive patterning processes that result in a skip-via where each pair of via portions is fully aligned. The fully aligned via pairs increase the contact area, thereby reducing overall interconnect resistance. In addition, the subtractive patterning process employed to form the skip-via allows for trimming one or more of the via portions. As a result, the distance between a given via portion of the skip-via and a neighboring metal line and/or metal via can be reduced.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an interconnect structure, the method comprising:
    forming a first electrically conductive via portion on an upper surface of a substrate, first electrically conductive via portion elongated along a first direction;
    depositing a first fill material 1 on the substrate to cover the first electrically conductive via portion, and etching the first fill material to expose an upper surface of the first electrically conductive via portion;
    forming a second electrically conductive via portion on the first fill material and the upper surface of the first electrically conductive via portion to establish a contact area, the second electrically conductive via portion elongated along a second direction orthogonal with respect to the first direction; and
    depositing a second fill material on the first fill material to cover the second electrically conductive via portion;
    wherein the first and second electrically conductive via portions are fully aligned at the contact area.

2. The method of claim 1, wherein fully-aligning the first and second electrically conductive via portions at the contact area defines a fully-aligned skip-via that extends completely through the first and second ILD materials.

3. The method of claim 2, further comprising recessing exposed portions of the upper surface of the first electrically conductive via portion while preserving the second electrically conductive via portion and a covered portion of the first electrically conductive via portion covered by the second electrically conductive via portion to form a trimmed portion that is fully-aligned with each of the first electrically conductive via portion and the second electrically conductive via portion.

4. The method of claim 3, wherein respective sides of the trimmed portion are co-planar with opposing sides of the first electrically conductive via portion and the opposing sides of the second electrically conductive via portion such that the trimmed portion is fully aligned with the first electrically conductive via portion and the second electrically conductive via portion.

5. The method of claim 1, wherein the first and second electrically conductive via portions include a metal material selected from a group comprising of copper, tungsten, cobalt, rhodium, platinum, molybdenum, and combinations thereof.

6. The method of claim 1 further comprising:
    forming a third electrically conductive via portion on an etched surface of the second ILD and an upper surface of the second electrically conductive via portion to establish a second contact area, the third electrically conductive via portion elongated along the first direction; and
    depositing a third ILD material on the second ILD material to cover the third electrically conductive via portion,
    wherein the second and third electrically conductive via portions are fully aligned at the second contact area.

7. The method of claim 6, wherein fully-aligning the first and second electrically conductive via portions at the contact area and fully-aligning the second and third electrically conductive via portions at the second contact area defines a fully-aligned skip-via that that extends completely through each of the first, second, and third ILD materials.

8. A method of fabricating an interconnect structure, the method comprising:
- forming a first electrically conductive via portion on an upper surface of a substrate, the first electrically conductive via elongated along a first direction;
- depositing a via liner material on sidewalls and an upper surface of the first electrically conductive via portion;
- depositing a first interlayer dielectric (ILD) material on the substrate to cover the first electrically conductive via portion, and etching the ILD material to expose an upper surface of the first electrically conductive via portion and the via material defining a via liner between the first ILD and the first electrically conductive via portion;
- forming a second electrically conductive via portion on the first ILD and the upper surface of the first electrically conductive via portion to establish a contact area, the second electrically conductive via portion elongated along a second direction orthogonal with respect to the first direction; and
- depositing a second ILD material on the first ILD material to cover the second electrically conductive via portion;
- wherein the first and second electrically conductive via portions are fully aligned at the contact area.

9. The method of claim 8, wherein fully-aligning the first and second electrically conductive via portions at the contact area defines a fully-aligned skip-via that extends completely through the first and second ILD materials.

10. The method of claim 9 further comprising recessing exposed portions of the upper surface of the first electrically conductive via portion while preserving the second electrically conductive via portion and a covered portion of the first electrically conductive via portion covered by the second electrically conductive via portion to form a trimmed portion that is fully-aligned with each of the first electrically conductive via portion and the second electrically conductive via portion.

11. The method of claim 10, wherein respective sides of the trimmed portion are co-planar with opposing sides of the first electrically conductive via portion and the opposing sides of the second electrically conductive via portion such that the trimmed portion is fully aligned with the first electrically conductive via portion and the second electrically conductive via portion.

12. The method of claim 8, wherein the first and second electrically conductive via portions include a metal material selected from a group comprising of copper, tungsten, cobalt, rhodium, platinum, molybdenum, and combinations thereof.

13. The method of claim 8 further comprising:
- prior to depositing the second ILD material, depositing a second via liner material on sidewalls and an upper surface of the second electrically conductive via portion; and
- depositing the second ILD material on the first ILD to cover the second via liner material and the second electrically conductive via portion to define the fully-aligned skip-via.

14. The method of claim 13, wherein the material of the first and second via liner materials are selected from a group comprising tantalum nitride (TaN), titanium nitride (TiN) and titanium oxide ($Ti_2O_3$).

* * * * *